(12) United States Patent
Hashimoto

(10) Patent No.: US 7,342,179 B2
(45) Date of Patent: Mar. 11, 2008

(54) ELECTRONIC DEVICE AND METHOD FOR PRODUCING THE SAME

(75) Inventor: Nobuaki Hashimoto, Suwa (JP)

(73) Assignee: Seiko Epson Corporation (JP)

( * ) Notice: Subject to any disclaimer, the term of this patent is extended or adjusted under 35 U.S.C. 154(b) by 346 days.

(21) Appl. No.: 11/024,992

(22) Filed: Dec. 29, 2004

(65) Prior Publication Data
US 2005/0150684 A1    Jul. 14, 2005

(30) Foreign Application Priority Data
Jan. 14, 2004    (JP)    ............... 2004-006426

(51) Int. Cl.
*H05K 1/16*    (2006.01)
(52) U.S. Cl. ............ 174/260; 174/261; 361/792
(58) Field of Classification Search ........ 174/261–266, 174/260; 361/792–795
See application file for complete search history.

(56) References Cited

U.S. PATENT DOCUMENTS

| 4,878,611 | A | 11/1989 | LoVasco et al. | |
| 6,855,603 | B2* | 2/2005 | Choi et al. | 438/268 |
| 6,982,492 | B2* | 1/2006 | Rumer et al. | 257/783 |
| 6,989,325 | B2* | 1/2006 | Uang et al. | 438/613 |
| 7,012,441 | B2* | 3/2006 | Chou et al. | 324/754 |
| 2005/0142933 | A1* | 6/2005 | Beer et al. | 439/540.1 |
| 2005/0285116 | A1* | 12/2005 | Wang | 257/76 |

FOREIGN PATENT DOCUMENTS

| JP | 62-024855 | 2/1987 |
| JP | 63-12142 | 1/1988 |
| JP | 04-213884 | 8/1992 |
| JP | 04-323884 | 11/1992 |
| JP | 05-327202 | 12/1993 |
| JP | 06-342795 | 12/1994 |
| JP | 11-233568 | 8/1999 |
| JP | 11-245081 | 9/1999 |
| JP | 2002-126869 | 5/2002 |
| JP | 2002-359470 | 12/2002 |
| JP | 2003-519378 | 6/2003 |
| JP | 2004-327908 | 11/2004 |
| WO | WO 01/50106 | 1/2001 |

OTHER PUBLICATIONS

Abstract of EP 0 440 049 A1 dated Aug. 7, 1991.
Communication from Japanese Patent Office regarding related application.

* cited by examiner

*Primary Examiner*—Jeremy C Norris
(74) *Attorney, Agent, or Firm*—Harness, Dickey & Pierce, P.L.C.

(57) ABSTRACT

An electronic device includes a plurality of components, nanoparticles to bond the components, and a receiving layer for holding the nanoparticles, the receiving layer being disposed on at least one of the bonded components. The electronic device may further include an electrode disposed on at least one of the plurality of components. The receiving layer is disposed on the surface of the electrode. Conductive particles etc. are mixed in the receiving layer.

9 Claims, 3 Drawing Sheets

ELECTRONIC DEVICE AND METHOD FOR PRODUCING THE SAME

CROSS-REFERENCE TO RELATED APPLICATION

The entire disclosure of Japanese Patent Application No. 2004-006426 filed Jan. 14, 2004 is hereby incorporated by reference.

BACKGROUND OF THE INVENTION

1. Field of the Invention

The present invention relates to an electronic device and a method for producing the same, and in particular, to an electronic device formed by bonding a plurality of components with nanoparticles and a method for producing the same.

2. Description of the Related Art

In a known method using crystal grain growth at an electrical interconnecting portion for micro electro-mechanical systems (MEMS), a first layer of a MEMS device is electrically connected with a second layer thereof by growing conductive crystal grains between the first layer and second layer (see, for example, PCT Japanese Translation Patent Publication No. 2003-519378, FIG. 1).

In a known printed circuit board and a method for producing the same, tin particles and silver particles are filled in via holes formed in a resin film, and the resultant resin film is sintered by heating to establish electrical connection between conductor patterns (see, for example, Japanese Unexamined Patent Application Publication No. 2002-359470, FIG. 3).

In the above-cited known method using crystal grain growth at the electrical interconnecting portion for MEMS (see, for example, PCT Japanese Translation Patent Publication No. 2003-519378, FIG. 1), manufacturing equipment such as vacuum equipment is required, thereby increasing the production cost. Furthermore, although this method using crystal grain growth can electrically connect the first layer and the second layer, this method cannot be applied to bonding, for example, a semiconductor device and a substrate together.

In the above-cited known printed circuit board and the method for producing the same (see, for example, Japanese Unexamined Patent Application Publication No. 2002-359470, FIG. 3), the resin film must be heated at a high temperature during sintering the tin particles and the silver particles. Unfortunately, this heating deteriorates the reliability of the product.

SUMMARY OF THE INVENTION

Accordingly, it is an object of the present invention to provide a highly reliable electronic device and a method for producing an electronic device at a low production cost and with high bonding reliability.

An electronic device according to the present invention includes a plurality of components, nanoparticles to bond the components, and a receiving layer for holding the nanoparticles, the receiving layer being disposed on at least one of the bonded components.

In the present invention, a plurality of components are bonded with nanoparticles having a low melting temperature. Since the components can be bonded at a relatively low temperature, the components to be bonded suffer less damage. In addition, since the receiving layer for holding the nanoparticles are disposed on at least one of the bonded components, the bonding strength can be increased.

According to the electronic device of the present invention, the number of the components may be two and the receiving layer may be disposed on each components.

In this case, receiving layers are disposed on both components. For example, when the nanoparticles are applied to the receiving layers on both components to bond the two components, the bonding reliability of the components can be further improved.

According to the electronic device of the present invention, the receiving layer may have electrical conductivity.

Since the receiving layer has electrical conductivity, the components forming the electronic device can be electrically connected to each other.

The electronic device according to the present invention may further include an electrode disposed on an at least one of the plurality of components, and the receiving layer may be disposed on the surface of the electrode.

In this case, the receiving layer is disposed on the surface of the electrode. Accordingly, when the nanoparticles are applied on the receiving layer to bond the components, the components can be bonded at a relatively low temperature. As a result, the components to be bonded suffer less damage. Furthermore, the formation of the receiving layer can also improve the bonding reliability.

According to the electronic device of the present invention, conductive particles may be mixed in the receiving layer.

Since conductive particles are mixed in the receiving layer, the components forming the electronic device can be electrically connected to each other. Nanoparticles can be used as the conductive particles.

According to the electronic device of the present invention, conductive fibers may be mixed in the receiving layer.

Since conductive fibers are mixed in the receiving layer, the components forming the electronic device can be electrically connected to each other.

According to the electronic device of the present invention, the receiving layer may be formed by metal plating.

Since the receiving layer is formed by metal plating, the components forming the electronic device can be electrically connected to each other.

According to the electronic device of the present invention, the receiving layer may be composed of conductive carbon nanotubes.

Since the receiving layer is composed of conductive carbon nanotubes, the components forming the electronic device can be electrically connected to each other.

An electronic device according to the present invention includes a plurality of components, nanoparticles to bond the components, an electrode disposed on at least one of the bonded components, and a receiving structure for holding the nanoparticles, the receiving structure being formed on the surface of the electrode.

In this case, an electrode is disposed on at least one of the bonded components, and a receiving structure for holding the nanoparticles is formed on the surface of the at least one electrode. Since the components can be bonded at a relatively low temperature, the components to be bonded suffer less damage. In addition, the formation of the receiving structure can increase the bonding strength.

According to the electronic device of the present invention, the receiving structure may be formed by chemically or physically modifying the surface of the electrode.

For example, the surface of the electrode is chemically modified by introducing a hydrophilic group. As a result, the retention of the nanoparticles can be increased and the bonding strength of the components can also be increased.

An electronic device according to the present invention includes a plurality of components, nanoparticles to bond the components, and a receiving layer in which the nanoparticles are mixed, the receiving layer being disposed on at least one of the bonded components.

A plurality of components are bonded with nanoparticles having a low melting temperature. Since the components can be bonded at a relatively low temperature, the components to be bonded suffer less damage. In addition, since the receiving layer mixed with the nanoparticles is disposed on at least one of the bonded components, the bonding strength can be increased.

According to the electronic device of the present invention, some or all of the nanoparticles may be bonded together by fusing.

For example, as a result of heating, some or all of the nanoparticles are bonded together by fusing. Thus, an electronic device having high bonding strength can be realized.

According to the electronic device of the present invention, the nanoparticles may contain a metallic substance.

When the components are bonded using nanoparticles containing a metallic substance, the bonding strength can be increased. Furthermore, the components can be bonded at a low cost.

According to the electronic device of the present invention, the nanoparticles may be formed of gold, silver, or copper.

When the components are bonded using gold, silver, or copper particles as the nanoparticles, the bonding strength can be increased. In addition, since the nanoparticles formed of gold, silver, or copper are readily available, the cost of bonding can be reduced.

According to the present invention, a method for producing an electronic device to bond a plurality of components with nanoparticles includes the steps of forming a receiving layer on at least one of the components to be bonded, applying the nanoparticles on the surface of the receiving layer, and heating the plurality of components while facing each other.

A plurality of components are bonded with nanoparticles having a low melting temperature. Since the components can be bonded at a relatively low temperature, the components to be bonded suffer less damage. Furthermore, the receiving layer is formed on at least one of the components to be bonded, and the nanoparticles are applied on the surface of the receiving layer. As a result, the bonding strength can be increased.

According to the method for producing an electronic device of the present invention, the number of the components may be two and the receiving layer may be formed on each component.

In this case, receiving layers are formed on both components. For example, when the nanoparticles are applied on both receiving layers to bond the two components, the bonding reliability of the components can be further improved.

According to the method for producing an electronic device of the present invention, the receiving layer may be formed so as to have electrical conductivity.

Since the receiving layer is formed to have electrical conductivity, the components forming the electronic device can be electrically connected to each other.

The method for producing an electronic device according to the present invention may further include the step of forming an electrode on at least one of the plurality of components, and the a receiving layer may be formed on the surface of the electrode.

In this case, the receiving layer is formed on the surface of the electrode. Accordingly, when the nanoparticles are applied on the receiving layer to bond the components, the components can be bonded at a relatively low temperature. As a result, the components to be bonded suffer less damage. Furthermore, the formation of the receiving layer can also improve the bonding reliability.

The method for producing an electronic device according to the present invention may further include the step of mixing conductive particles in the receiving layer.

Since conductive particles are mixed in the receiving layer, the components forming the electronic device can be electrically connected to each other. Nanoparticles can be used as the conductive particles.

The method for producing an electronic device according to the present invention may further include the step of mixing conductive fibers in the receiving layer.

Since conductive fibers are mixed in the receiving layer, the components forming the electronic device can be electrically connected to each other.

According to the method for producing an electronic device of the present invention, the receiving layer may be formed by metal plating.

Since the receiving layer is formed by metal plating, the components forming the electronic device can be electrically connected to each other.

According to the method for producing an electronic device of the present invention, the receiving layer may be formed using conductive carbon nanotubes.

Since the receiving layer is formed using conductive carbon nanotubes, the components forming the electronic device can be electrically connected to each other.

According to the present invention, a method for producing an electronic device to bond a plurality of components with nanoparticles includes the steps of forming an electrode on at least one of the components to be bonded, forming a receiving structure on the surface of the electrode, applying the nanoparticles on the receiving structure, and heating the plurality of components while facing each other.

In this case, an electrode is formed on at least one of the components to be bonded, and a receiving structure for holding the nanoparticles is formed on the surface of at least one of the electrodes. Since the components can be bonded at a relatively low temperature, the components to be bonded suffer less damage. In addition, the formation of the receiving structure can increase the bonding strength.

According to the method for producing an electronic device of the present invention, the receiving structure may be formed by chemically or physically modifying the surface of the electrode.

For example, the surface of the electrode is chemically modified by introducing a hydrophilic group. As a result, the retention of the nanoparticles can be increased and the bonding strength of the components can also be increased.

According to the present invention, a method for producing an electronic device to bond a plurality of components with nanoparticles includes the steps of forming a receiving layer on at least one of the components to be bonded, mixing the nanoparticles in the receiving layer, and heating the plurality of components while facing each other.

A plurality of components are bonded with nanoparticles having a low melting temperature. Since the components can be bonded at a relatively low temperature, the components to be bonded suffer less damage. Furthermore, the receiving layers are formed on at least one of the components to be bonded, and the nanoparticles are mixed in the at least one receiving layer. As a result, the bonding strength can be increased.

According to the method for producing an electronic device of the present invention, some or all of the nanoparticles may be bonded to each other by melting.

For example, as a result of heating, some or all of the nanoparticles are bonded to each other by melting. Thus, an electronic device having high bonding strength can be produced.

According to the method for producing an electronic device of the present invention, the nanoparticles may contain a metallic substance.

When the components are bonded using nanoparticles containing a metallic substance, the bonding strength can be increased. Furthermore, the components can be bonded at a low cost.

According to the method for producing an electronic device of the present invention, the nanoparticles may be formed of gold, silver, or copper.

When the components are bonded using gold, silver, or copper particles as the nanoparticles, the bonding strength can be increased. In addition, since the nanoparticles formed of gold, silver, or copper are readily available, the cost of bonding can be reduced.

According to the method for producing an electronic device of the present invention, the nanoparticles may be coated with a dispersing material before the heating step.

Since the nanoparticles are coated with a dispersing material before the heating step, the nanoparticles can be applied on the receiving layer etc. in a stable state.

According to the method for producing an electronic device of the present invention, the step of applying the nanoparticles on the surface of the receiving layer may be performed by ink-jetting.

Since the nanoparticles are applied on the surface of the receiving layer by ink-jetting, the nanoparticles can be applied evenly and precisely.

According to the method for producing an electronic device of the present invention, the step of applying the nanoparticles on the surface of the receiving layer may be performed by printing.

When the nanoparticles are applied on the surface of the receiving layer by, for example, screen printing, the nanoparticles can be applied evenly and precisely.

According to the method for producing an electronic device of the present invention, the step of applying the nanoparticles on the surface of the receiving layer may be performed by transferring.

For example, when the nanoparticles are disposed on a plate and are applied on the surface of the receiving layer by transferring, the nanoparticles can be applied evenly and precisely as in the ink-jetting method.

According to the method for producing an electronic device of the present invention, the step of applying the nanoparticles on the surface of the receiving layer may be performed by dripping.

When the nanoparticles are applied on the surface of the receiving layer by dripping, the nanoparticles can be applied on a wide area within a short time, compared with the ink-jetting method.

According to the method for producing an electronic device of the present invention, a pressure may be applied in the heating step.

When a pressure is applied during heating, the bonding reliability of the components can be further improved.

DESCRIPTION OF THE PREFERRED EMBODIMENTS

First Embodiment

FIGS. 1A to 1C and FIGS. 2D and 2E are schematic cross-sectional views showing a production process of an electronic device according to a first embodiment of the present invention. Although two components are bonded in this embodiment shown in FIGS. 1A to 1C and FIGS. 2D and 2E, this process can be applied to bond at least three components, for example, to bond a plurality of semiconductor devices with a substrate. In addition, although FIGS. 1A to 1C and FIGS. 2D and 2E show two bonding portions, the number of bonding portions may be one or three or more. According to the present invention, examples of the electronic device include a circuit board bonded with a semiconductor device (i.e., integrated circuit (IC)), semiconductor devices bonded together, and micro electromechanical systems (MEMS).

Figure 1A:
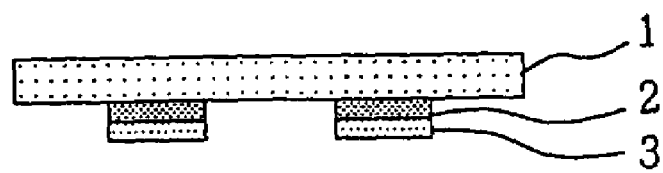
FIGS. 1A to 1C are schematic cross-sectional views showing a production process of an electronic device according to a first embodiment of the present invention.

Firstly, electrodes 2 are formed on two components 1. Receiving layers 3 are formed on the surfaces of the electrodes 2 (FIG. 1A). Examples of these components 1 include a circuit board, a semiconductor device, and a circuit board having a semiconductor device mounted thereon. Although the components 1 in FIG. 1A have a flat plate shape, the components 1 may have different shapes. Furthermore, the two components 1 may be different kinds of components, for example, a circuit board and a semiconductor device. The electrodes 2 can be formed by standard sputtering etc. and may be formed in advance during the production of the components 1.

The receiving layers 3 are chiefly composed of polyamic acids, acrylic resins, alumina hydrate, calcium carbonate, magnesium carbonate, synthetic silica fine particles, talc, caolin, calcium sulfate, and barium sulfate. The receiving layers 3 are formed by spraying or coating with a machine. Before the receiving layers 3 are formed on the electrodes 2, the surfaces of the electrodes 2 may be roughened so as to improve the adherence between the electrodes 2 and the receiving layers 3.

In the first embodiment, conductive particles are mixed in the receiving layers 3 to provide the receiving layers 3 with electrical conductivity. As will be described later, nanoparticles composed of a metallic substance can be used as the conductive particles. Alternatively, conductive particles having a diameter larger than that of the nanoparticles may be used. Instead of the conductive particles, conductive fibers may also be used. In order to further improve the electrical conductivity of the receiving layers 3, the receiving layers 3 themselves may be composed of conductive particles such as metal particles or conductive ceramic particles.

The receiving layers 3 may be formed by metal plating. In order to improve the retention of nanoparticles (which will be described later in detail), the surfaces of the receiving layers 3 formed by metal plating may be adequately roughened or processed so as to be porous or hydrophilic.

Furthermore, the receiving layers 3 may be composed of conductive carbon nanotubes or carbon nanohorns to provide the receiving layers 3 with electrical conductivity. Each of the above receiving layers 3 need not be a single layer; it may be composed of multiple layers.

Thus, electrical conductivity is provided to the receiving layers 3. As a result, the components 1 can be electrically connected with each other to function as an electronic device.

Figure 1B:
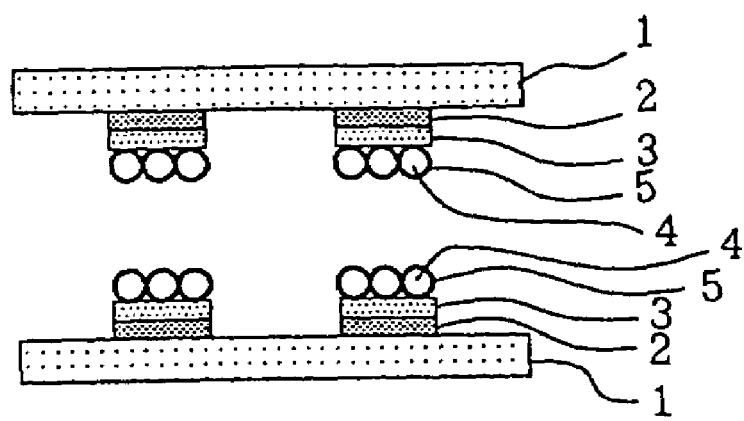

Subsequently, nanoparticles 4 coated with a dispersing material 5 are applied on both receiving layers 3 formed on the surfaces of the electrodes 2 (FIG. 1B). For example, particles of a metallic substance having a diameter of about 10 nm is used as the nanoparticles 4. In particular, gold, silver, or copper particles are used as the nanoparticles 4. When a plurality of the components 1 forming the electronic device are bonded using the nanoparticles 4 composed of such a metallic substance, the bonding strength is increased. The dispersing material 5, which protects the nanoparticles 4, maintains the nanoparticles 4 in a stable state before the nanoparticles 4 are heated. Examples of the dispersing material 5 include various hydrocarbons.

For example, the nanoparticles 4 coated with the dispersing material 5 are mixed with a solvent to form paste or ink, and the mixture is then applied on the receiving layers 3. These nanoparticles 4 forming paste or ink can be applied by, for example, ink-jetting, printing, transferring, or dripping. In the ink-jetting method, the nanoparticles 4 mixed with a solvent are applied by jetting with an ink-jet head. In the printing method, the nanoparticles 4 mixed with a solvent are applied by printing, for example, by screen printing. In the transferring method, the nanoparticles 4 are disposed on a plate and are applied by transferring. In this transferring method, the nanoparticles 4 need not be mixed with a solvent etc. to form paste or ink. In the dripping method, the nanoparticles 4 mixed with a solvent are applied by jetting with a dispenser etc. In these methods, the nanoparticles 4 may be selectively applied only on the surfaces of the receiving layers 3. Alternatively, the nanoparticles 4 may be applied on the entire surfaces of the components 1 provided that there is no problem of short-circuits of the electrodes 2.

Figure 1C:
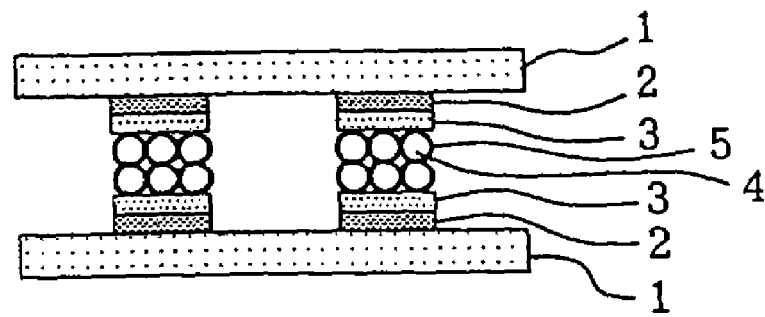

The components 1 including nanoparticles 4 applied on the receiving layers 3, which are shown in FIG. 1B, face each other such that the components 1 are in contact with each other (FIG. 1C). In this state, since the nanoparticles 4 are protected with the dispersing material 5, the nanoparticles 4 are held on the receiving layers 3 in a stable state.

Figure 2D:
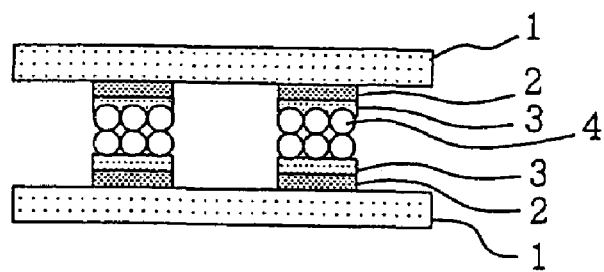
FIGS. 2D and 2E are schematic cross-sectional views showing the subsequent steps of the production process of the electronic device in FIGS. 1A to 1C.

Subsequently, the two components 1 facing so as to be in contact with each other in FIG. 1C are heated (FIG. 2D). As a result of heating the two components 1, some or all of the nanoparticles 4 applied on the receiving layers 3 become bonded together by fusing. The nanoparticles 4 and the receiving layers 3 are also bonded together because some of the nanoparticles 4 are fused to be closely contacted with the receiving layer 3. Thus, the two components 1 are bonded together. Since the nanoparticles 4 have a large surface area relative to the volume, the nanoparticles 4 are highly reactive. Therefore, the heating temperature may be as low as, for example, about 150° C. to 200° C. Although FIG. 2D shows the state in which the nanoparticles 4 remain unchanged, some or all of the nanoparticles 4 are actually bonded together by fusing to form a connected state.

When the components 1 are heated in the step shown in FIG. 2D, most of the dispersing material 5 coating the nanoparticles 4 is generally evaporated.

In order to increase the bonding strength of the components 1, the heating step shown in FIG. 2D may be performed while applying a pressure. Referring to FIG. 1B, the nanoparticles 4 are applied on both receiving layers 3 disposed on each of the two components 1. Alternatively, the nanoparticles 4 may be applied only on receiving layers 3 disposed on one component. In this case, the same advantage as that of the components including the nanoparticles applied on receiving layers on both sides can be achieved, so long as the nanoparticles are transferred onto another receiving layers on the other component before the nanoparticles are fused (in other words, while the nanoparticles still function as individual nanoparticles that are mixed with a solvent in a liquid state).

Figure 2E:
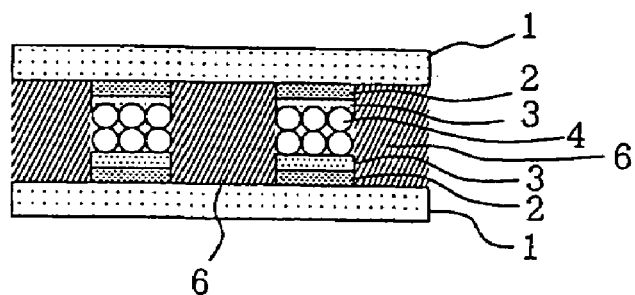

Finally, the space formed between the two components 1 that are bonded together in the step shown in FIG. 2D is sealed with a resin 6 to complete an electronic device 7 (FIG. 2E). As shown in FIG. 2E, this resin sealing protects the electronic device 7 with the resin 6 to improve the reliability of the electronic device. The step of resin sealing shown in FIG. 2E is not necessarily performed.

In the first embodiment, conductive particles are mixed in the receiving layers 3 to provide the receiving layers 3 with electrical conductivity. Alternatively, the receiving layers 3 may be not conductive, to use for bonding in a standard electronic device. Examples of this case include the bonding of a glass substrate with a silicon substrate in MEMS. In this case, the electrodes 2 shown in FIG. 1A to FIG. 2E are not required.

Referring to FIG. 1A to FIG. 2E, the electronic device includes two components 1, and the receiving layers 3 are formed on both components 1. Alternatively, in the bonding of a plurality of components (for example, three components or more), the receiving layers may be formed on at least one of the components.

Furthermore, the receiving layers 3 mixed with the nanoparticles 4 may be formed on at least one of the components 1 to be bonded. In order to form the receiving layers 3 mixed with the nanoparticles 4, for example, a powdery polyamic acid is mixed with nanoparticles and the mixture is then applied or sprayed. In this case, for example, the receiving layers 3 are brought into contact with each other and are heated, thereby bonding the components 1, so that the additional nanoparticles 4 need not be applied on the surfaces of the receiving layers 3. In addition, when conductive particles composed of, for example, a metallic substance are used as the nanoparticles 4, a plurality of components can be electrically connected. Therefore, the formation of the electrodes 2 is not essential.

In the first embodiment, a plurality of the components 1 are bonded with the nanoparticles 4 having a low melting temperature. Since the components 1 can be bonded at a relatively low temperature, the components 1 to be bonded suffer less damage. In addition, since the receiving layers 3 for holding the nanoparticles 4 is disposed on at least one of the bonded components 1, the bonding strength is increased.

The receiving layers 3 may be disposed on both components 1, and the nanoparticles 4 may be applied on the receiving layers 3 on both components to be bonded. This structure further improves the bonding reliability between the two components 1.

Furthermore, conductive particles or conductive fibers may be mixed in the receiving layers 3. The receiving layers 3 may also be formed by metal plating or may be composed of conductive carbon nanotubes. This structure allows the components 1 constituting the electronic device to be electrically connected to each other.

Second Embodiment

Figure 3A:
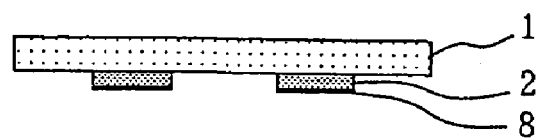
FIGS. 3A and 3B are schematic cross-sectional views showing a production process of an electronic device according to a second embodiment of the present invention.
Figure 3B:
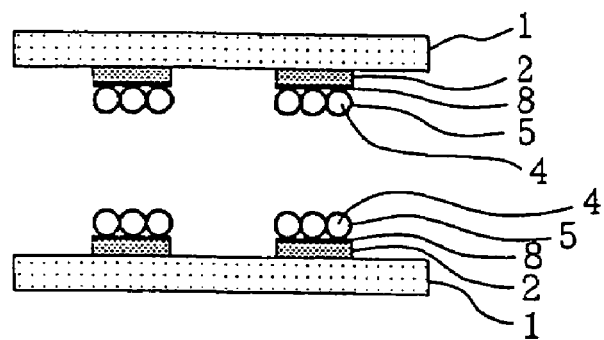

FIGS. 3A and 3B are schematic cross-sectional views showing a production process of an electronic device according to a second embodiment of the present invention. In this second embodiment, instead of the receiving layers 3 in the first embodiment, receiving structures 8 for holding nanoparticles 4 are formed on the surfaces of electrodes 2. In the manufacturing process in the second embodiment, the step shown in FIG. 1A in the first embodiment is replaced with the step shown in FIG. 3A, and the step shown in FIG. 1B in the first embodiment is replaced with the step shown in FIG. 3B. The subsequent steps are the same as those shown in FIG. 1C, FIG. 2D, and FIG. 2E. Other aspects are the same as those in the first embodiment, and the same elements as those in the first embodiment have the same reference numerals. The second embodiment will now be described.

Firstly, electrodes 2 are formed on both components 1. Receiving structures 8 are formed on the surfaces of the electrodes 2 (FIG. 3A). The electrodes 2 can be formed as in the first embodiment. As in the first embodiment, electrodes 2 and receiving structures 8 may be formed on at least one of the plurality of components 1 to be bonded.

Any structure can be used as the receiving structures 8 so long as the receiving structures 8 have a function to improve wettability of, for example, a solvent in paste form or in ink form mixed with nanoparticles 4. For example, the receiving structures 8 can be formed by chemically or physically modifying the surfaces of the electrodes 2. Examples of the method for chemically modifying the surfaces of the electrodes 2 include the introduction of a hydrophilic group on the surfaces of the electrodes 2 by an oxidation process or a hydroxylation process. Alternatively, a coupling agent etc. may be applied on the surfaces of the electrodes 2. Examples of the method for physically modifying the surfaces of the electrodes 2 include increasing the roughness of the surfaces of the electrodes 2 by mechanical polishing or chemical polishing, and increasing the surface energy of the electrodes 2 by irradiation of an electron beam or light.

The receiving structures 8 may be formed by depositing an organic substance or an inorganic substance on the surfaces of the electrodes 2 by, for example, evaporation or sputtering. The receiving structures 8 may also be formed by electroless plating or electrolytic plating. Any substance can be used as the receiving structures 8 so long as wettability of the above-mentioned solvent etc. is improved.

Subsequently, nanoparticles 4 coated with a dispersing material 5 are applied on both receiving structures 8 formed on the electrodes 2, as in the first embodiment (FIG. 3B). The subsequent bonding steps are the same as those shown in FIG. 1C, FIG. 2D, and FIG. 2E.

In the second embodiment, electrodes 2 are formed on at least one of the bonded components 1, and a receiving structure 8 for holding nanoparticles 4 is formed on at least one of the surfaces of the electrodes 2. As a result, the bonding strength of this electronic device is increased, like that in the electronic device in the first embodiment, which includes the receiving layers 3.

Third Embodiment

Figure 4A:
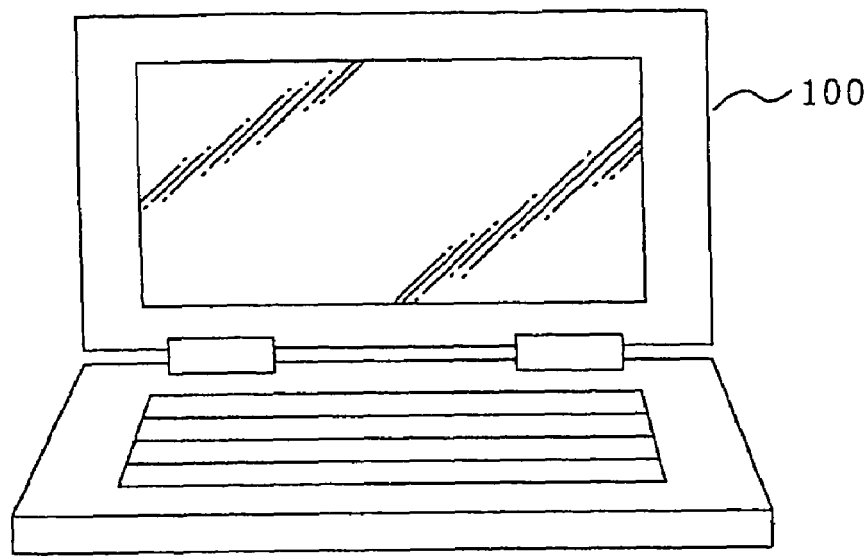
FIGS. 4A and 4B are views showing examples of electronic equipment according to a third embodiment of the present invention.
Figure 4B:
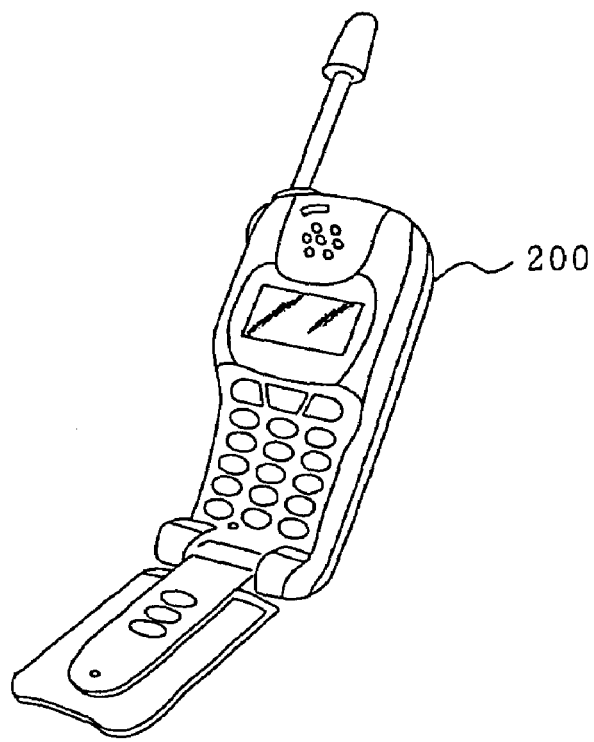

FIGS. 4A and 4B are views showing examples of electronic equipment according to a third embodiment of the present invention. The electronic equipment shown in the third embodiment includes the electronic device produced by the methods for producing the electronic device described in the first embodiment and the second embodiment. FIG. 4A shows a notebook-size personal computer 100 as an example of the electronic equipment. FIG. 4B shows a cellular phone 200 as an example of the electronic equipment. The electronic devices shown in the first embodiment and the second embodiment can also be used in, for example, other household electronic appliances.

What is claimed is:

1. An electronic device comprising:
   two components;
   a receiving layer on at least one of the two components, the receiving layer including at least one of conductive particles and conductive fibers; and
   metallic nanoparticles on the receiving layer and bonding the two components together;
   wherein at least some of the nanoparticles are bonded together and closely contacted with the receiving layer by fusing.

2. The electronic device according to claim 1, wherein the receiving layer includes any one of polyamic acids, acrylic resins, alumina hydrate, calcium carbonate, magnesium carbonate, synthetic silica fine particles, talc, caolin, calcium sulfate, and barium sulfate.

3. The electronic device according to claim 1, wherein an electrode is disposed on at least one of the two components and the receiving layer is disposed on a surface of the electrode.

4. The electronic device according to claim 3, wherein the surface of the electrode is chemically or physically modified in wettability.

5. The electronic device according to claim 1, wherein the metallic nanoparticles are formed of at least one of gold, silver, and copper.

6. An electronic device comprising:
   two components;
   a receiving layer on at least one of the two components, the receiving layer being composed of conductive carbon nanotubes; and
   metallic nanoparticles on the receiving layer and bonding the two components together;
   wherein at least some of the nanoparticles are bonded together and closely contacted with the receiving layer by fusing.

7. The electronic device according to claim 6, wherein an electrode is disposed on at least one of the two components and the receiving layer is disposed on a surface of the electrode.

8. The electronic device according to claim 7, wherein the surface of the electrode is chemically or physically modified in wettability.

9. The electronic device according to claim 6, wherein the metallic nanoparticles are formed of at least one of gold, silver, and copper.

* * * * *